United States Patent [19]

Desai et al.

[11] 4,397,938

[45] Aug. 9, 1983

[54] METHOD OF FORMING RESIST PATTERNS USING X-RAYS OR ELECTRON BEAM

[75] Inventors: Nitin V. Desai, Hightstown; Emil J. Gavalchin, Princeton Junction, both of N.J.

[73] Assignee: RCA Corporation, New York, N.Y.

[21] Appl. No.: 330,492

[22] Filed: Dec. 14, 1981

[51] Int. Cl.$^3$ ................................................ G03C 5/00
[52] U.S. Cl. ................................ 430/296; 204/159.14; 204/159.2; 430/270; 430/313; 430/326; 430/331; 528/364; 528/382
[58] Field of Search ............... 430/270, 296, 326, 313, 430/331; 204/159.14, 159.2; 528/364, 382

[56] References Cited

U.S. PATENT DOCUMENTS

| | | | |
|---|---|---|---|
| 3,884,696 | 5/1975 | Bowden et al. | 96/35 |
| 3,890,287 | 6/1975 | Moore et al. | 528/364 |
| 3,893,127 | 7/1975 | Kaplan et al. | 346/1 |
| 3,931,435 | 1/1976 | Gipstein et al. | 427/43 |
| 3,935,331 | 1/1976 | Poliniak et al. | 427/43 |
| 3,935,332 | 1/1976 | Poliniak et al. | 427/43 |
| 4,153,741 | 5/1979 | Poliniak et al. | 427/38 |

OTHER PUBLICATIONS

Chemical Abstract 85: 78465e, "Mechanism of Alternating Copolymerization of Sulfur Dioxide With Donor Monomers," Stoyachenko, I. L.

Thompson et al., *Journal of the Electrochemical Society*, Dec. 1973, pp. 1722-1726.

*Primary Examiner*—Jack P. Brammer
*Attorney, Agent, or Firm*—Birgit E. Morris; R. Hain Swope

[57] ABSTRACT

In accordance with this invention, there is provided a positive resist medium for microlithography which is comprised of a film of a copolymer of sulfur dioxide and certain vinyl esters. A method of manufacturing microelectronic circuits and recording information utilizing the resist medium of this invention is also provided.

12 Claims, No Drawings

METHOD OF FORMING RESIST PATTERNS USING X-RAYS OR ELECTRON BEAM

This invention relates to positive electron beam resist media and the use thereof to record information, particularly in the manufacture of electronic devices including microelectronic circuits.

BACKGROUND OF THE INVENTION

Significant advances in recent years in the reduction in physical size and cost of electronic circuits have resulted from improvements in techniques for the manufacture of microelectronic circuits, e.g. microlithography. In general, microlithography comprises applying a film of a radiation-sensitive polymeric material, i.e. a resist medium, to one surface of a substrate, irradiating selected portions of the film with, e.g. ultraviolet light, an electron beam, X-ray or the like, and developing the film with a solvent to remove solubilized portions thereof. In the instance of a positive resist, the portions of the film irradiated become more soluble in the developer solvent than non-irradiated portions. The resist medium remaining on the surface of the substrate is then employed as a protective mask to facilitate the selective etching or other treatment of the exposed portions of the substrate.

Etching of the substrate may be conventionally carried out by chemical treatment or by plasma discharge. Plasma etching, generally, affords finer resolution than chemical etching and is additionally advantageous in that it is free of the pollution and handling problems inherent in the use of chemical etchants. Many resist materials, however, cannot withstand plasma discharge and are eroded along with the substrate, resulting in complete loss of pattern definition. Therefore, chemical etching is more commonly used in spite of the above-named disadvantages.

There is a continuing search for polymeric materials with increased sensitivity to radiation such as electron beam radiation to achieve higher resolution in answer to the demand for ever-finer circuitry. The poly(olefin sulfones) are a major group of resist media described in the literature. Although a significant number of poly(olefin sulfones) are known to those of ordinary skill in the art, only one, i.e. poly(1-butenesulfone), is commercially available. Although a sensitive resist medium, this material is disadvantageous in that: it does not adhere well to certain substrates, particularly chromium; it must be exposed at an electron beam dose of 1 $\mu C/cm^2$ which is at or near the capacity of the irradiation apparatus in many installations; and it has poor resistance to plasma etching.

In accordance with this invention, there is provided a positive electron beam recording media which has increased sensitivity in comparison with poly(1-butenesulfone) and which possesses excellent adherence to chromium.

SUMMARY OF THE INVENTION

In accordance with this invention, there is provided a positive resist medium for microlithography which is comprised of a film of a copolymer of certain vinyl esters and sulfur dioxide.

DETAILED DESCRIPTION OF THE INVENTION

The polymeric materials utilized as resist media in accordance with this invention are copolymers having repeating units represented by the formula

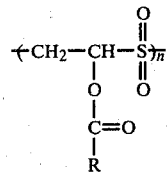

wherein R is an alkyl group and n is an integer. Although the length of the alkyl chain is not particularly critical to the performance of recording media prepared from the copolymers of this invention, shorter chains, i.e., wherein R is lower alkyl, are preferred, with methyl and tert.-butyl being particularly preferred. As utilized herein, the term "lower alkyl" indicates a straight- or branched-chain alkyl group having 1 to 6 carbon atoms.

While the copolymer of vinyl acetate and sulfur dioxide has been reported in the literature, the remaining copolymers of this invention, i.e., copolymers of the above formula wherein R is an alkyl group having two to six carbon atoms, are novel compounds. The copolymers of this invention may be prepared, for example, by conventional free radical polymerization techniques, preferably utilizing a known initiator such as, for example, t-butylhydroperoxide. The subject copolymers contain the vinyl ester and sulfur dioxide in a 1:1 ratio.

The molecular weight of the copolymers of this invention should be sufficiently high so that, when areas of resist medium film formed therefrom are selectively irradiated with, for example, an electron beam, there will be a sufficient reduction in molecular weight to cause a significant difference in the relative solubility of the irradiated and non-irradiated portions of the film.

The molecular weight of the subject copolymers is further important in terms of their solubility in the solvents used for casting such films. In general, the molecular weight of the copolymers of this invention should be at least 50,000, preferably from about 50,000 to about 200,000, and more preferably about 100,000. The molecular weight of the copolymer is conventionally controlled by the amount of free radical initiator present with increased amounts of initiator present giving lower molecular weights.

The positive electron beam resist medium of this invention is formed by applying to a substrate a solution of the copolymer in a suitable organic solvent. The solution is applied to the substrate by casting, spin coating, spraying or other conventional means, with spin coating being preferred. The solution generally contains from about 10 to about 14 percent by weight of the copolymer. Suitable solvents should have boiling points below the decomposition point of the copolymer, thus permitting removal of the solvent from the film by conventional heating or vacuum drying to form a uniform resist medium film on the substrate.

Suitable solvents for the copolymers of this invention are tetrahydrofuran, 2-methoxyethylacetate, cyclopentanone and the like, with cyclopentanone and 2-methoxyethylacetate being preferred. The films can be cast on the substrate in various thicknesses from about 0.1 micron to about 10 microns, depending on the intended use of the resist image. It is preferred to cast films of the subject copolymers at a thickness of from about 0.9 to about 1.0 micrometer.

After the film is formed, it is preferred to bake it in air or vacuum, usually at a temperature above the glass transition temperature of the subject copolymers, but below their thermal decomposition point. The baking removes traces of solvent and anneals out stresses and strains in the resist film. The subject copolymers, particularly wherein R is methyl in the above formula, are unique in that, unlike other resist media described in the literature, a baking step is not usually required after the resist film has been developed. The elimination of this so-termed post-bake step is advantageous, both in terms of time and energy saved.

Portions of the recording medium resist films of this invention are selectively irradiated with, for example, an electron beam, a modulated electron beam or X-ray, thereby causing degradation of the copolymer in the irradiated areas. It is preferred to irradiate films of the subject copolymers with an electron beam or a modulated electron beam. Generally, for exposure of a resist medium film having a thickness of from about 0.9 to about 1.0 micrometers, electron beam irradiation from about 0.4 to about 1.6 micro-coulomb/$cm^2$ is utilized.

When utilized as positive working resists, films of the copolymers of this invention are cast for a thickness equal to or less than the depth of the penetration of the electron beam, thus exposing the substrate upon development. Alternatively, the copolymers of this invention can be utilized as media for recording surface relief patterns by exposing thicker films to well-defined patterns of irradiation which, upon development, correspond in relief to the information recorded.

The irradiated film may be developed utilizing a solvent which will dissolve both the irradiated and non-irradiated portions, but will dissolve the irradiated portion more rapidly. Utilizing this method, the thickness of the resist film is adjusted so that, after development, there will be sufficient film remaining in the non-irradiated areas to protect the underlying substrate during subsequent operations such as etching, thereby preserving resolution.

Films formed from the copolymers of this invention will erode to a significant degree, i.e., 50 percent or more, in non-irradiated areas during development, even with most preferred solvents. However, the films are unique in that, in spite of this substantial erosion, they do not lose adherence to the substrate and are relatively free from pinholes. Because the films formed from the copolymers of this invention have relatively few pinholes and have markedly superior adhesion, particularly to chromium, the high degree of erosion is not considered disadvantageous and can be compensated for by, e.g., increasing film thickness.

It is preferred, in accordance with this invention, to develop the resist film with a combination of a solvent which will dissolve both the irradiated and non-irradiated portions of the film and a compatible non-solvent or weak solvent therefor. Preferred combinations of such solvents include cyclclopentanone and 3-methylcyclohexanol, 2-methylcyclohexanol or 5-methyl-2-hexanone, most preferably in a ratio of from about 1:1 to about 3:1.

The resist film, after the irradiated portion is removed, may provide a pattern on the substrate which is used as a guide for the formation of circuits and the like.

The substrates which may be advantageously treated in accordance with this invention include, for example, plastic or a plastic laminate, porcelain-coated steel, ceramic wafers, chrome- or nickel-coated glass, and the like, on which it is desired to form a microelectronic circuit. A particularly preferred substrate in accordance with this invention, is chromium coated glass because of the excellent adhesion of the subject resist films to chromium. Wherein portions of the surface of the substrate have been exposed by development of the resist film, the desired pattern is formed by use of a conventional etchant therefore, e.g., ferric chloride solutions for steel, hydrofluoric acid solutions for glass, and the like.

The following examples further illustrate this invention, it being understood that the invention is in no way intended to be limited to the details described therein. In the examples, all parts and percentages are on a weight basis and all temperatures in degrees Celsius unless otherwise stated.

EXAMPLE 1

A reaction tube was cooled to $-70°$ with a dry ice/isopropanol mixture. Under constant temperature, 30 ml of sulfur dioxide and 15 ml of vinyl acetate were throughly mixed in the tube. To this mixture was added 0.2 ml of t-butylhydroperoxide under a nitrogen blanket. The contents of the tube became plugged after several hours. The tube and contents were maintained at $-70°$ for a total of 24 hours after which the solid contained therein was dissolved in dimethylformamide and precipitated by methanol. The product was dissolved in acetone and reprecipitated in methanol. The product was dried overnight at $40°$ under vacuum. Analysis of the resulting copolymer showed it to be a one-to-one copolymer having a molecular weight of approximately 100,000.

Using the above procedure, a copolymer was prepared utilizing 40 ml of sulfur dioxide, 20 ml of vinyl 2-ethylhexanoate and 0.4 ml of t-butylhydroperoxide. The product had a molecular weight of approximately 60,000.

EXAMPLE 2

A 14 percent by weight solution of the vinyl acetate/sulfur dioxide copolymer of Example 1 in 2-methoxyethylacetate was prepared and filtered through a 0.2 micrometer tetrafluoroethylene filter. One-half inch square reflective chromium substrates available from Tau Industries, Inc. were cleaned by spraying with acetone and isopropanol, respectively, while the substrate was spinning at 2,000 rpm.

The solution was spin-coated onto the chromium substrate to a thickness of 1 micrometer. A group of samples was baked at $95°$ for 30 minutes. The remainder were baked at $75°$ for 30 minutes. The coated substrates were irradiated with electron beam utilizing a scanning electron microscope equipped with a microprocessor. A total of 16 fine-line patterns were utilized. The minimum dose per individual sample was 0.4 $\mu C/cm^2$ and the maximum was 1.6 $\mu/cm^2$.

The samples were developed utilizing a 3:1 mixture of cyclopentanone and 2-methylcyclohexanol at $22°$. Samples receiving a 0.4 $\mu C/cm^2$ dosage and baked for 30 minutes at $95°$ were fully developed in 3 minutes, 30 seconds. Samples baked at $75°$ required only 1 minute, 30 seconds for full development. Room temperature and humidity had no observable effect on development time.

The samples were directly etched without a conventional post bake stop utilizing a standard chromium etch solution of ceric ammonium nitrate and acetic acid in water at ambient temperature. The remaining resist was removed with acetone. Microscopic examination of the chromium substrate showed excellent etch pattern with no evidence of loss of adherence of the resist.

The particular high reflectivity chromium substrates utilized for this experiment were selected because, of the chromium substrate blanks commercially available, they have shown the largest incidence of partial or total loss of adhesion. This experience has been gained utilizing a variety of resist materials including poly(3-methylcyclopentene sulfone), poly(3-methylcyclopentene-10-undecynoic acid-sulfone) and poly(butenesulfone). With regard to the latter, commercially coated chromium blanks have likewise demonstrated loss of adhesion with resultant loss of resolution.

It is significant in view of this experience that in a lot of 100 samples of Tau HR chromium blanks coated with the subject copolymers as above without the inclusion of a conventional post-bake step, not one demonstrated loss of adhesion.

What is claimed is:

1. A method of forming a patterned layer on a substrate consisting essentially of:
   (a) coating the substrate with a composition comprising a solution of a positive acting resist copolymer having a molecular weight of from about 50,000 to about 200,000 and consisting of repeating units represented by the formula

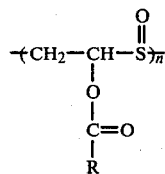

wherein
R is an alkyl group and n is an integer, in a suitable solvent;
   (b) drying the coating to form a positive recording medium;
   (c) irradiating a predetermined portion of said medium with an electron beam, a modulated electron beam or x-ray; and
   (d) developing the irradiated portion of the medium with a suitable developer.

2. A method in accordance with claim 1, wherein R is lower alkyl.

3. A method in accordance with claim 2, wherein R is selected from the group consisting of methyl and tert.-butyl.

4. A method in accordance with claim 3, wherein R is methyl.

5. A method in accordance with claim 1, wherein said composition includes from about 10 to about 14 percent by weight of said copolymer.

6. A method in accordance with claim 5, wherein said solvent is cyclopentanone or 2-methoxyethylacetate.

7. A method in accordance with claim 1, wherein said medium is irradiated with an electron beam.

8. A method in accordance with claim 1, wherein said medium is irradiated with a modulated electron beam.

9. A method in accordance with claim 1, wherein said developer is a combination of cyclopentanone and 3-methylcyclohexanol, 2-methylcyclohexanol or 5-methyl-2-hexanone in a ratio of from about 1:1 to about 3:1.

10. A method in accordance with claim 9, wherein said developer is a combination of cyclopentanone and 2-methylcyclohexanol in a ratio of 3:1.

11. A method in accordance with claim 1, wherein said substrate is chromium on glass and development exposes corresponding portions of the substrate.

12. A method in accordance with claim 11 additionally including etching the exposed substrate with a suitable etchant.

* * * * *